United States Patent
Chen et al.

(10) Patent No.: US 12,002,410 B2
(45) Date of Patent: Jun. 4, 2024

(54) ARRAY SUBSTRATE AND DETECTION METHOD THEREFOR, AND TILED DISPLAY PANEL

(71) Applicant: BOE Technology Group Co., Ltd., Beijing (CN)

(72) Inventors: Hao Chen, Beijing (CN); Zhenyu Zhang, Beijing (CN); Jiao Zhao, Beijing (CN); Li Xiao, Beijing (CN); Dongni Liu, Beijing (CN); Haoliang Zheng, Beijing (CN); Liang Chen, Beijing (CN); Minghua Xuan, Beijing (CN); Ming Yang, Beijing (CN); Xinhong Lu, Beijing (CN); Qi Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 8 days.

(21) Appl. No.: 17/642,025

(22) PCT Filed: Apr. 8, 2021

(86) PCT No.: PCT/CN2021/085957
§ 371 (c)(1),
(2) Date: Mar. 10, 2022

(87) PCT Pub. No.: WO2021/227713
PCT Pub. Date: Nov. 18, 2021

(65) Prior Publication Data
US 2022/0406245 A1 Dec. 22, 2022

(30) Foreign Application Priority Data
May 13, 2020 (CN) .......................... 202010404359.0

(51) Int. Cl.
*G09G 3/32* (2016.01)
*G01R 31/52* (2020.01)
(Continued)

(52) U.S. Cl.
CPC ............... *G09G 3/32* (2013.01); *G01R 31/52* (2020.01); *G01R 31/54* (2020.01); *G09G 3/006* (2013.01);
(Continued)

(58) Field of Classification Search
CPC .......... G09G 3/006; G09G 3/035; G09G 3/32; G09G 2300/0426; G09G 2300/0452;
(Continued)

(56) References Cited

U.S. PATENT DOCUMENTS 6,496,238 B1 * 12/2002 Greene ................. G02F 1/1345
349/73
2012/0127559 A1 5/2012 Van Der Plas et al.
(Continued)

FOREIGN PATENT DOCUMENTS

CN 109298801 A 2/2019
CN 10010093 A 7/2019
(Continued)

OTHER PUBLICATIONS

European Partial Supplementary Search Report, dated Dec. 15, 2022, from European Patent App. No. 21803664.8.

*Primary Examiner* — Jason M Mandeville
(74) *Attorney, Agent, or Firm* — Workman Nydegger

(57) ABSTRACT

An array substrate, a detection method for the array substrate, and a tiled display panel. In the array substrate, each of pixels (1) comprises sub-pixels (01) of at least three colors and a pixel driving chip (02) for driving each sub-pixel (01) to emit light; each sub-pixel (01) comprises at least one inorganic light-emitting diode; a display area (A1)
(Continued)

further comprises: a positive signal line (Hm) connected to a positive electrode of each inorganic light-emitting diode, and a data signal line (Dm), a scanning line (Sn), and a reference signal line (Vm) connected to each pixel driving chip (02); each pixel driving chip (02) is used for writing signals of the data signal line (Dm) into the sub-pixels (01) of different colors under the control of the corresponding scanning line (Sn) in a time division manner.

14 Claims, 12 Drawing Sheets

(51) Int. Cl.
*G01R 31/54* (2020.01)
*G09G 3/00* (2006.01)
*H01L 25/075* (2006.01)
*H01L 27/12* (2006.01)
*H01L 33/62* (2010.01)
*G09F 9/33* (2006.01)

(52) U.S. Cl.
CPC ......... *G09G 3/035* (2020.08); *H01L 25/0753* (2013.01); *H01L 27/1244* (2013.01); *H01L 33/62* (2013.01); *G09F 9/33* (2013.01); *G09G 2300/0426* (2013.01); *G09G 2300/0452* (2013.01); *G09G 2320/0233* (2013.01); *G09G 2330/021* (2013.01)

(58) Field of Classification Search
CPC ..... G09G 2320/0233; G09G 2330/021; G01R 31/52; G01R 31/54; H01L 25/0753; H01L 27/1244; H01L 33/62; H01L 27/124; G09F 9/3026; G09F 9/33
USPC ........................................................ 345/691
See application file for complete search history.

(56) References Cited

U.S. PATENT DOCUMENTS

| | | | |
|---|---|---|---|
| 2018/0130405 A1* | 5/2018 | Lee | ............................ G09G 3/32 |
| 2018/0158894 A1 | 6/2018 | Park et al. | |
| 2018/0247586 A1* | 8/2018 | Vahid Far | ............ G09G 3/3216 |
| 2019/0206319 A1 | 7/2019 | Kim et al. | |
| 2019/0206330 A1 | 7/2019 | Kim et al. | |
| 2019/0206333 A1 | 7/2019 | Kim et al. | |
| 2020/0341574 A1 | 10/2020 | Xu et al. | |
| 2021/0264848 A1* | 8/2021 | Yamashita | ........... G09G 3/2011 |

FOREIGN PATENT DOCUMENTS

| | | |
|---|---|---|
| CN | 109994068 A | 7/2019 |
| CN | 109994071 A | 7/2019 |
| CN | 111103726 A | 5/2020 |
| CN | 211654192 U | 10/2020 |
| EP | 2952957 A1 | 12/2015 |
| EP | 3226234 A1 | 10/2017 |
| WO | 2016200635 A1 | 12/2016 |

* cited by examiner

ARRAY SUBSTRATE AND DETECTION METHOD THEREFOR, AND TILED DISPLAY PANEL

CROSS REFERENCE TO RELATED APPLICATIONS

The present application is a National Stage of International Application No. PCT/CN2021/085957, filed on Apr. 8, 2021, which claims priority to the Chinese Patent Application No. 202010404359.0, filed to the China Patent Office on May 13, 2020, the entire contents of which are incorporated herein by reference.

FIELD

The present disclosure relates to the technical field of display, in particular to an array substrate and a method for detecting the array substrate, and a splicing display panel.

BACKGROUND

Compared with an organic light-emitting diode (OLED), a light-emitting diode in a mini dimension or even a micro dimension based on an inorganic light-emitting diode principle belongs to a self-luminous device like the OLED and also has, like the OLED, a series of advantages of high brightness, ultra-low latency, an ultra-large viewing angle, etc. An inorganic light-emitting diode emits light on the basis of a metal semiconductor (not an organic matter) with more stable properties and lower resistance, thereby having advantages of being lower in power consumption, more resistant to high temperature and low temperature and longer in service life compared with the OLED.

SUMMARY

Embodiments of the present disclosure provide an array substrate and a method for detecting the array substrate, and a splicing display panel. A specific solution is as follows.

In a first aspect, an array substrate provided by an embodiment of the present disclosure includes: a display region, provided with a plurality of scanning lines, a plurality of data signal lines, a plurality of positive signal lines and a plurality of reference signal lines, and a plurality of pixels arranged in an array mode; and a bezel region; wherein at least one of the plurality of pixels includes: sub-pixels of at least three colors and a pixel driving chip driving each of the sub-pixels to emit light; each of the sub-pixels includes at least one inorganic light-emitting diode; the pixel driving chip is connected with a positive electrode of the inorganic light-emitting diode in each of the sub-pixels it drives, at least one of the plurality of data signal lines, at least one of the plurality of scanning lines and at least one of the plurality of reference signal lines, and the pixel driving chip is configured to write a signal of the data signal line into the sub-pixels of different colors under control of the scanning line corresponding to the pixel driving chip, in a time division, wherein the reference signal line is configured to provide a negative signal for the pixel driving chip so as to form a current path between the inorganic light-emitting diode and the pixel driving chip.

Optionally, in the array substrate provided by the embodiment of the present disclosure, the plurality of pixels include N pixel rows arranged in a first direction and M pixel columns arranged in a second direction, wherein N and M are both integers larger than 1; the plurality of scanning lines extend in the first direction and are arranged in the second direction, the plurality of data signal lines extend in the second direction and are arranged in the first direction, the plurality of positive signal lines extend in the second direction and are arranged in the first direction, and the plurality of reference signal lines extend in the second direction and are arranged in the first direction; and the first direction is different from the second direction.

Optionally, in the array substrate provided by the embodiment of the present disclosure, each of the pixel rows corresponds to one of the plurality of scanning lines, and each of the pixel columns corresponds to one of the plurality of data signal lines, one of the plurality of reference signal lines and one of the plurality of positive signal lines.

Optionally, in the array substrate provide by the embodiment of the present disclosure, each of the pixels includes: a first color sub-pixel, a second color sub-pixel and a third color sub-pixel; each of the pixel rows corresponds to one of the plurality of scanning lines, and each of the pixel columns corresponds to one of the plurality of data signal lines, one of the plurality of reference signal lines and two of the plurality of positive signal lines; and one of the two positive signal lines is connected with a positive electrode of an inorganic light-emitting diode in the first color sub-pixel, and the of the two positive signal lines is connected with positive electrodes of inorganic light-emitting diodes in the third color sub-pixel and the second color sub-pixel.

Optionally, in the array substrate provided by the embodiment of the present disclosure, the display region further includes scanning signal routing wires connected with the plurality of scanning lines in a one-to-one correspondence, and the scanning signal routing wires extend in the second direction.

Optionally, in the array substrate provided by the embodiment of the present disclosure, N=M, one side of each of the pixel columns is correspondingly provided with one of the scanning signal routing wires, and only one of the scanning signal routing wires is arranged between every two adjacent pixel columns.

Optionally, in the array substrate provided by the embodiment of the present disclosure, N>M, at least one of the scanning signal routing wires is arranged on each of two sides of at least one of the pixel columns; and at least one of the scanning signal routing wires is arranged between at least part of every two adjacent pixel columns, and a quantity of the scanning signal routing wires between the two adjacent pixel columns does not exceed two.

Optionally, in the array substrate provided by the embodiment of the present disclosure, the scanning lines are in a first metal layer, and the scanning signal routing wires, the data signal lines, the reference signal lines and the positive signal lines are in a second metal layer.

Optionally, in the array substrate provided by the embodiment of the present disclosure, the bezel region at one end of the data signal lines includes a bent region, a wiring region and a bonding region sequentially far away from the display region; at least one first chip and at least one second chip are arranged in the bonding region; the scanning signal routing wires and the data signal lines are sequentially connected with the first chip in a bonding mode through routing wires in the bent region and the wiring region; and the reference signal lines and the positive signal lines are sequentially connected with the second chip in a bonding mode through routing wires in the bent region and the wiring region.

Optionally, in the array substrate provided by the embodiment of the present disclosure, a plurality of first chips and a plurality of second chips are arranged in the bonding region; and the first chips and the second chips are distributed in the bonding region at intervals.

Optionally, in the array substrate provided by the embodiment of the present disclosure, the routing wires in the bent region are all in the second metal layer.

Optionally, in the array substrate provided by the embodiment of the present disclosure, in the wiring region, the routing wires connected with the scanning signal routing wires and the routing wires connected with the data signal lines are all in the first metal layer; and in the wiring region, the routing wires connected with the reference signal lines and the routing wires connected with the positive signal lines are all in the second metal layer.

Optionally, in the array substrate provided by the embodiment of the present disclosure, in the wiring region, the routing wires connected with the scanning signal routing wires and the routing wires connected with the data signal lines are all in the second metal layer; and in the wiring region, the routing wires connected with the reference signal lines and connected with the positive signal lines are all in the first metal layer.

Optionally, in the array substrate provided by the embodiment of the present disclosure, the scanning signal routing wires, the data signal lines, the reference signal lines and the positive signal lines are all longitudinal signal lines; the bezel region further includes: a first signal input region on one side of the bonding region far away from the wiring region and a second signal input region at one end of the data signal lines far away from the bent region; first input electrodes in one-to-one correspondence with the longitudinal signal lines are arranged in the first signal input region, and the respective longitudinal signal lines in the display region are connected with the respective first input electrodes sequentially through the routing wires in the bent region and the wiring region; and second input electrodes in one-to-one correspondence connection with the longitudinal signal lines are arranged in the second signal input region.

Optionally, in the array substrate provided by the embodiment of the present disclosure, the bezel region at one end of the scanning lines includes a third signal input region; the bezel region at another end of the scanning lines includes a fourth signal input region; third input electrodes in one-to-one correspondence connection with the scanning lines are arranged in the third signal input region; and fourth input electrodes in one-to-one correspondence connection with the scanning lines are arranged in the fourth signal input region.

In a second aspect, an embodiment of the present disclosure further provides a splicing display panel, including a plurality of any array substrate provided by the embodiment of the present disclosure.

In a third aspect, an embodiment of the present disclosure further provides a method for detecting any array substrate mentioned above. The longitudinal signal lines and the scanning lines in the display region are all to-be-detected lines. The method includes: inputting, for each of the to-be-detected lines, a test signal into one input electrode connected with a to-be-detected line; detecting whether another input electrode connected with the to-be-detected line outputs a signal, and in response to that the another input electrode connected with the to-be-detected line does not output the signal, determining that the to-be-detected line is disconnected; and detecting whether an input electrode of another to-be-detected line except the to-be-detected line input with the test signal outputs a signal, and in response to that the input electrode of the another to-be-detected line outputs the signal, determining that a short circuit occurs between the to-be-detected line input with the test signal and the another to-be-detected line the input electrode of which outputs the signal.

DETAILED DESCRIPTION OF THE EMBODIMENTS

Figure 1:
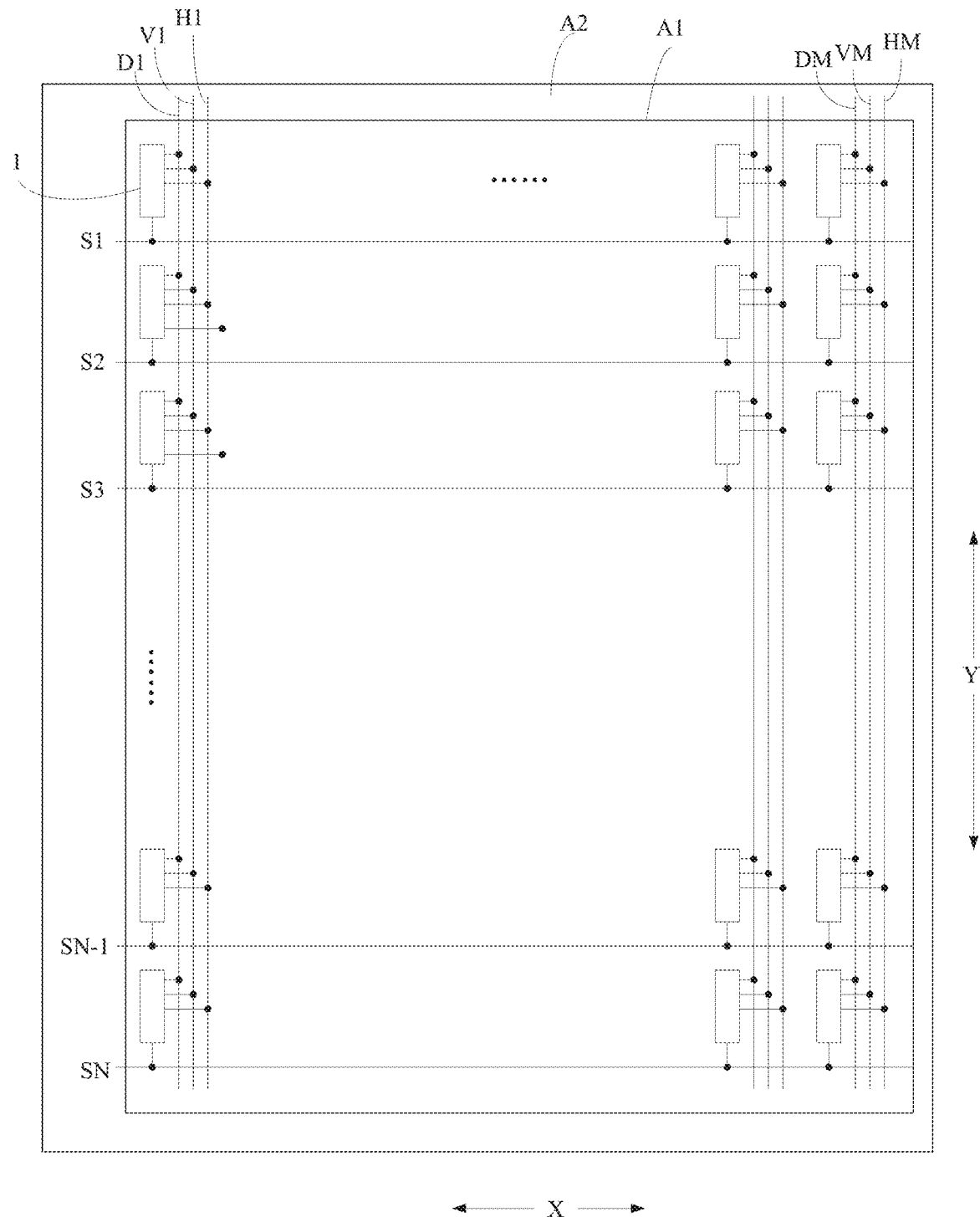
FIG. 1 is a schematic structural diagram of an array substrate provided by an embodiment of the present disclosure.

An inventor discovers that a mini light-emitting diode and a micro light-emitting diode have a problem of poor brightness uniformity under low current density, so the mini light-emitting diode and the micro light-emitting diode shall be driven to emit light by using large current density. Current density of a micro inorganic light-emitting diode is at least two orders of magnitude larger than current density of an organic light-emitting diode, so the micro inorganic light-emitting diode cannot be driven by a pixel circuit formed by a thin film transistor like the organic light-emitting diode, if it is driven by the pixel circuit formed by the thin film transistor, a size of the thin film transistor needs to be larger so as to generate large current density, the larger size of the thin film transistor leads to poor uniformity, power consumption is large, and a pixel circuit in an existing organic light-emitting diode cannot be directly applied to the micro inorganic light-emitting diode.

In view of this, embodiments of the present disclosure provide an array substrate, a method for detecting the array substrate and a splicing display panel.

In order to make the above objectives, features and advantages of the present disclosure clearer and more understandable, the present disclosure will be further described below with reference to accompanying drawings and embodiments. However, exemplary implementations can be implemented in various anodes and should not be constructed as being limited to the implementations set forth herein, rather these implementations are provided so as to make the present disclosure more comprehensive and complete, and a concept of the exemplary implementations is comprehensively conveyed to those skilled in the art. The same reference numbers in the drawings represent the same or similar structure, so their repeated description is omitted. Words denoting positions and directions described in the present disclosure are descriptions made by taking the drawings for example, which can also be changed as required, and all changes fall within the protection scope of the present disclosure. The drawings of the present disclosure are only intended to illustrate a relative position relation and do not represent a true scale.

It needs to be noted that specific details are set forth in the following description so as to fully understand the present disclosure. However, the present disclosure can be implemented in many other modes different from the description made herein, and those skilled in the art can make similar popularization without departing from an intension of the present disclosure. Therefore, the present disclosure is not limited by the specific implementations disclosed below. The subsequent description of the specification are preferable implementations for implementing the present application and aims to describe a general principle of the present application but not intends to limit the scope of the present application. The protection scope of the present application is determined by what is defined in the appended claims.

The array substrate, the method for detecting the array substrate and the splicing display panel provided by the embodiments of the present disclosure will be described in detail below with reference to the drawings.

Figure 2:
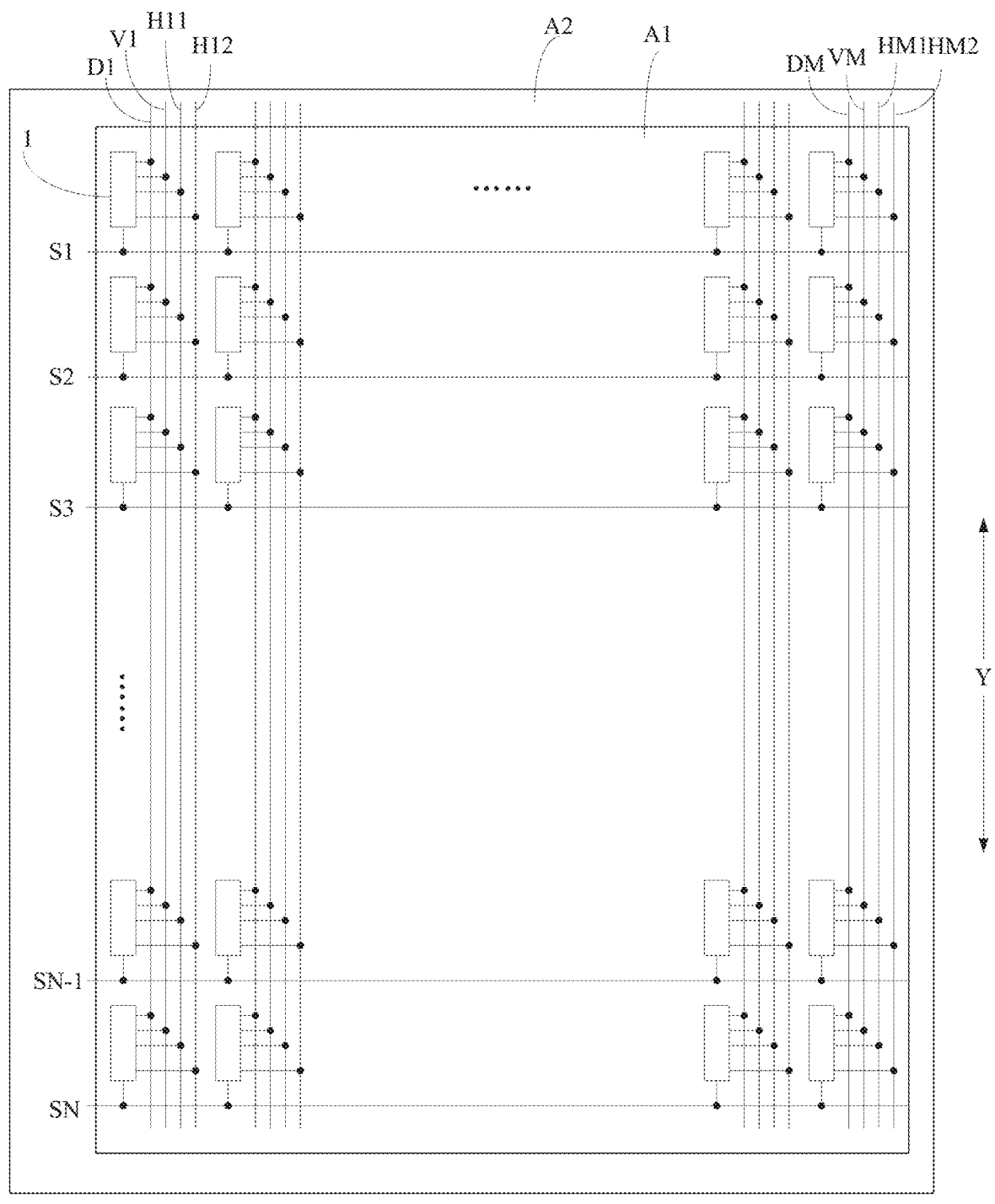
FIG. 2 is a schematic structural diagram of another array substrate provided by an embodiment of the present disclosure.

An array substrate provided by an embodiment of the present disclosure, as shown in FIG. 1 and FIG. 2, includes a display region A1 and a bezel region A2. The display region A1 has a plurality of pixels 1 arranged in a matrix, a plurality of scanning lines Sn, a plurality of data signal lines Dm, a plurality of positive signal lines Hm and a plurality of reference signal lines Vm.

Figure 3:
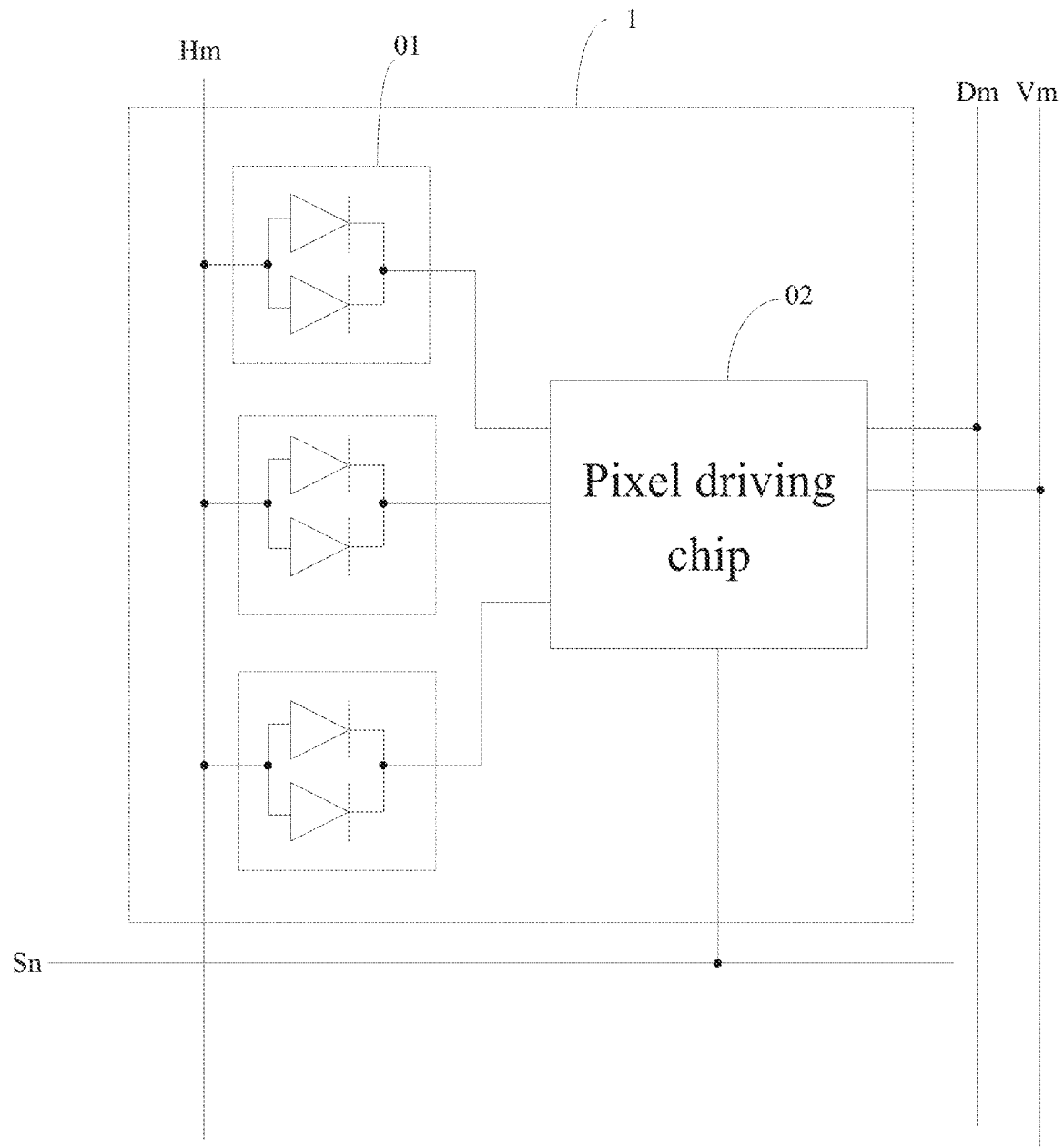
FIG. 3 is a schematic structural diagram of pixels in an array substrate provided by an embodiment of the present disclosure.

As shown in FIG. 3, each of the plurality of pixels 1 includes: sub-pixels 01 of at least three colors and a pixel driving chip 02 driving each of the sub-pixels 01 to emit light.

Each of the sub-pixels 01 includes at least one inorganic light-emitting diode.

The pixel driving chip 2 is connected with a positive electrode of the inorganic light-emitting diode in each of the sub-pixels 01 it drives, at least one of the plurality of data signal lines Dm, at least one of the plurality of scanning lines Sn and at least one of the plurality of reference signal lines Vm.

Each pixel driving chip 2 is configured to write a signal of the data signal line Din into the sub-pixels 01 of different colors under control of the corresponding scanning line Sn in a time division, wherein the reference signal line Vm is configured to provide a negative signal for the pixel driving chip 2 so as to form a current path between the pixel driving chip 2 and the inorganic light-emitting diode.

In the array substrate provided by the embodiment of the present disclosure, each of pixels includes: the sub-pixels of at least three colors and the pixel driving chip driving each of the sub-pixels to emit light; each of the sub-pixels includes at least one inorganic light-emitting diode; the display region further includes: the positive signal lines connected with positive electrodes of the inorganic light-emitting diodes, and the data signal lines, the scanning lines and the reference signal lines connected with the pixel driving chips; and the pixel driving chips are configured to write the signal of the data signal line into the sub-pixels of different colors in a time division under control of the scanning line, That is, in the embodiment of the present disclosure, all the pixels are driven directly by the pixel driving chips so as to realize display, Besides, as all the pixels can be driven directly by the pixel driving chips, large current density can be provided for the micro inorganic light-emitting diode.

During specific implementation, in the array substrate provided by the embodiment the present disclosure, the inorganic light-emitting diode may be a mini light emitting diode (abbr. Mini LED) or a micro light emitting diode (abbr. Micro LED), which is not limited herein.

During specific implementation, in the array substrate provided by the embodiment of the present disclosure, each of the sub-pixels includes at least one inorganic light-emitting diode, for example, each of the sub-pixels includes one inorganic light-emitting diode or two inorganic light-emitting diodes or three inorganic light-emitting diodes or more inorganic light-emitting diodes, which is not limited herein. Illustration is made in the drawings of the specification by taking each of the sub-pixels including the two inorganic light-emitting diodes for example.

Optionally, in the array substrate provided by the embodiment of the present disclosure, as shown in FIG. 1 and FIG. 3, the display region A1 includes N pixel rows arranged in a first direction X and M pixel columns arranged in a second direction Y, wherein N and M are both integers larger than 1.

The plurality of scanning lines Sn extend in the first direction X and are arranged in the second direction Y, the plurality of data signal lines Din extend in the second direction Y and are arranged in the first direction X, the plurality of positive signal lines Finn extend in the second direction Y and are arranged in the first direction X, and the plurality of reference signal lines Vm extend in the second direction Y and are arranged in the first direction X.

The first direction X and the second direction Y are different. Optionally, in order to reduce the quantity of wires in the display region, in the array substrate provided by the embodiment of the present disclosure, as shown in FIG. 1 and FIG. 3, each of the pixel rows is correspondingly connected with one of the plurality of scanning lines Sn, and each of the pixel columns corresponds to one of the plurality of data signal lines Dm, one of the plurality of reference signal lines Vm and one of the plurality of positive signal lines Hm.

Figure 4:
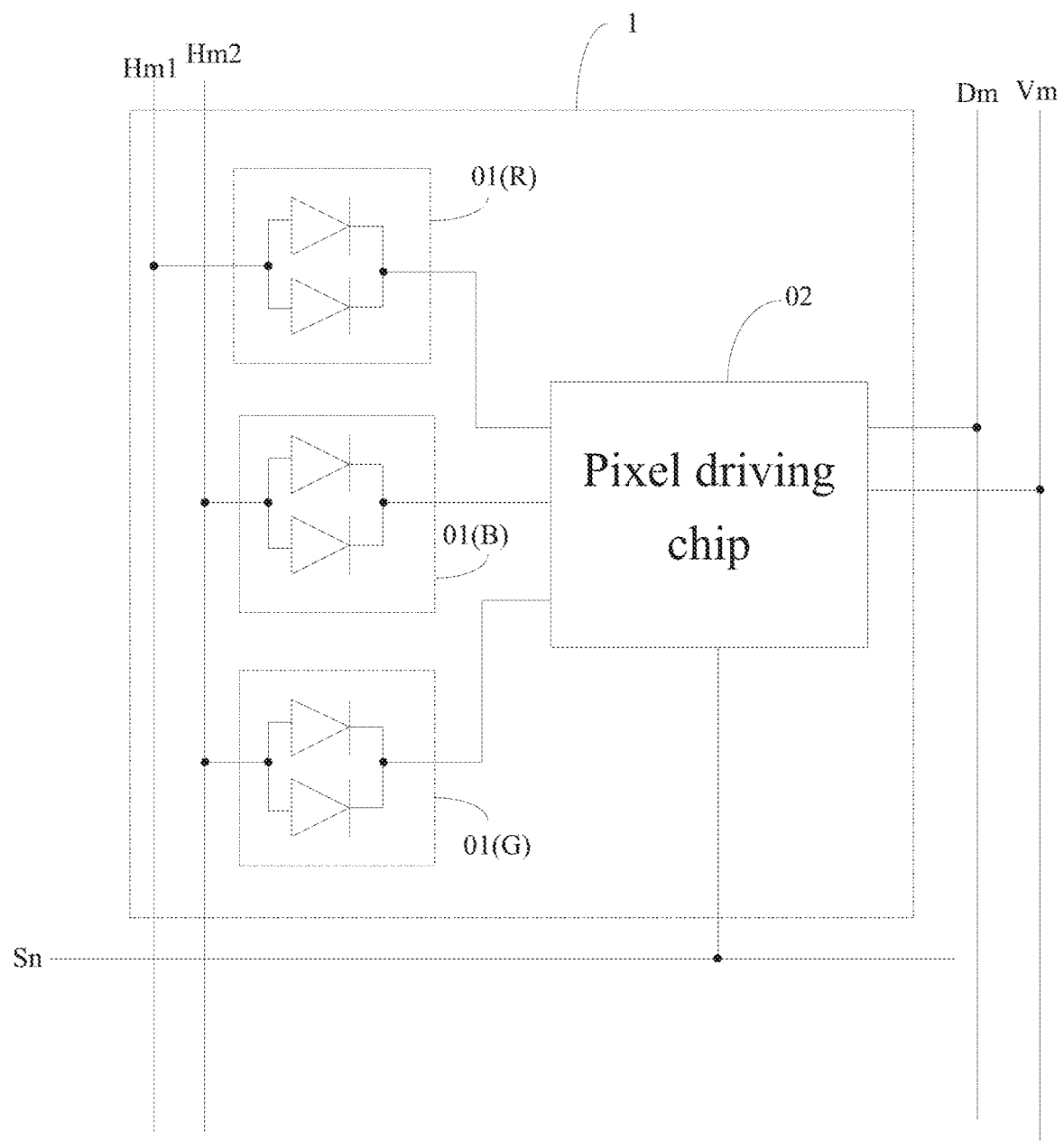
FIG. 4 is a schematic structural diagram of pixels in another array substrate provided by an embodiment of the present disclosure.

During specific implementation, a second color inorganic light-emitting diode and a third color inorganic light-emitting diode differ slightly in current conversion efficiency, and current conversion efficiency of both the second color inorganic light-emitting diode and the third color inorganic light-emitting diode differs greatly from current conversion efficiency of a first color inorganic light-emitting diode, so intensity of an electrical signal needing to be received by a positive electrode of the first color inorganic light-emitting diode differs greatly from intensity of electrical signals needing to be received by positive electrodes of the second color inorganic light-emitting diode and the third color inorganic light-emitting diode. When the sub-pixels of different colors in the same pixel correspond to the same one positive signal line, a signal needing to be provided by the positive signal line can make the first color inorganic light-emitting diode, the second color inorganic light-emitting diode and the third color inorganic light-emitting diode product maximum brightness, which leads to increase of power consumption. Optionally, in the array substrate provided by the embodiment of the present disclosure, as shown in FIG. 2 and FIG. 4, each of the pixels 1 includes: a first color sub-pixel 01 (R), a second color sub-pixel 01 (B) and a third color sub-pixel 01 (G).

Each of the pixel rows is correspondingly connected with one of the plurality of scanning lines Sn, and each of the pixel columns corresponds to one of the plurality of data signal lines Dm, one of the plurality of reference signal lines Vin and two of the plurality of positive signal lines Hm1 and Hm2.

One positive signal line Hm1 of the two positive signal lines Hm1 and Hm2 is connected with a positive electrode of an inorganic light-emitting diode of the first color sub-pixel 01 (R), and the other positive signal line Hm2 is connected with positive electrodes of inorganic light-emitting diodes in the third color sub-pixel 01 (G) and the second color sub-pixel 01 (B), Therefore, signals received by the positive electrodes of the inorganic light-emitting diodes in the third color sub-pixel 01 (G) and the second color sub-pixel 01 (B) may be the same, a signal received by the positive electrode of the inorganic light-emitting diode in the first color sub-pixel 01 (R) is larger in amplitude than the signals received by the sub-pixels of the other two colors so that a situation that the positive electrodes of the sub-pixels of the three colors can be prevented from all receiving a signal of which of the sub-pixels of the three colors needs a maximum signal amplitude, and thus power consumption can be reduced.

Figure 5:
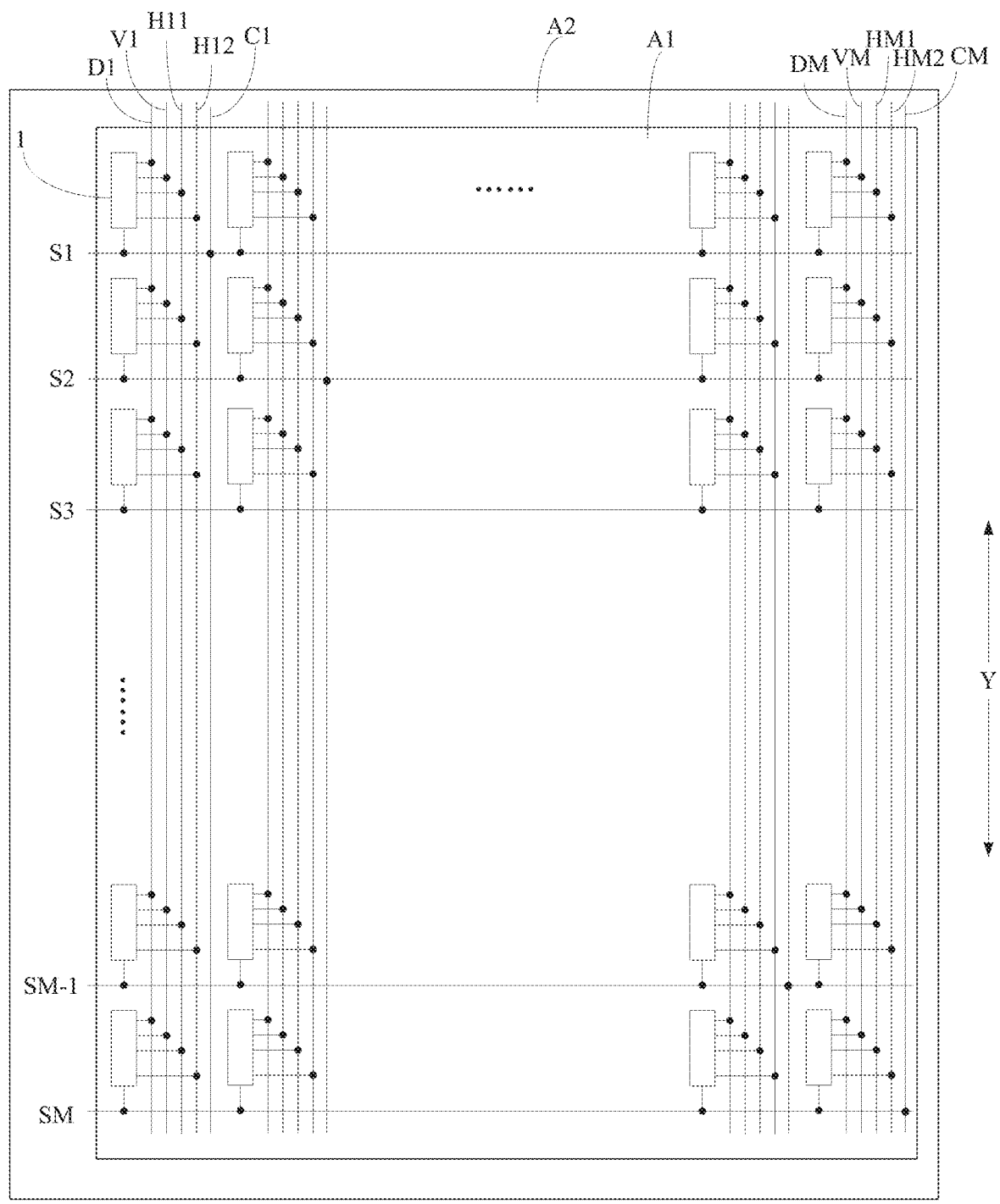
FIG. 5 is a schematic structural diagram of yet another array substrate provided by an embodiment of the present disclosure.

During specific implementation, the first color, the second color or the third color may be one of red, blue and green, for example, the first color is red, the second color is blue and the third color is green, which is not limited herein. Optionally, in the array substrate provided by the embodiment of the present disclosure, as shown in FIG. 5, the display region A1 further includes scanning signal routing wires Cn in one-to-one correspondence connection with the plurality of scanning lines Sn, and the scanning signal routing wires Cn extend in the second direction Y. In this way, scanning signals can be provided for the scanning lines Sn through the corresponding scanning signal routing wires Cn so that signal sources for providing the scanning signals can be arranged at two ends of the scanning signal routing wires Cn and chips for providing the scanning signals are prevented from being arranged at the two ends of the scanning lines Sn.

Optionally, in the array substrate provided by the embodiment of the present disclosure, as shown in FIG. 5, when the quantity N of the pixel rows is the same as the quantity M of the pixel columns in the display region A1, namely, N=M.

One side of each of the pixel columns is correspondingly provided with one of the scanning signal routing wires Cn, and only one of the scanning signal routing wires Cn is arranged between every two adjacent pixel columns.

Figure 6:
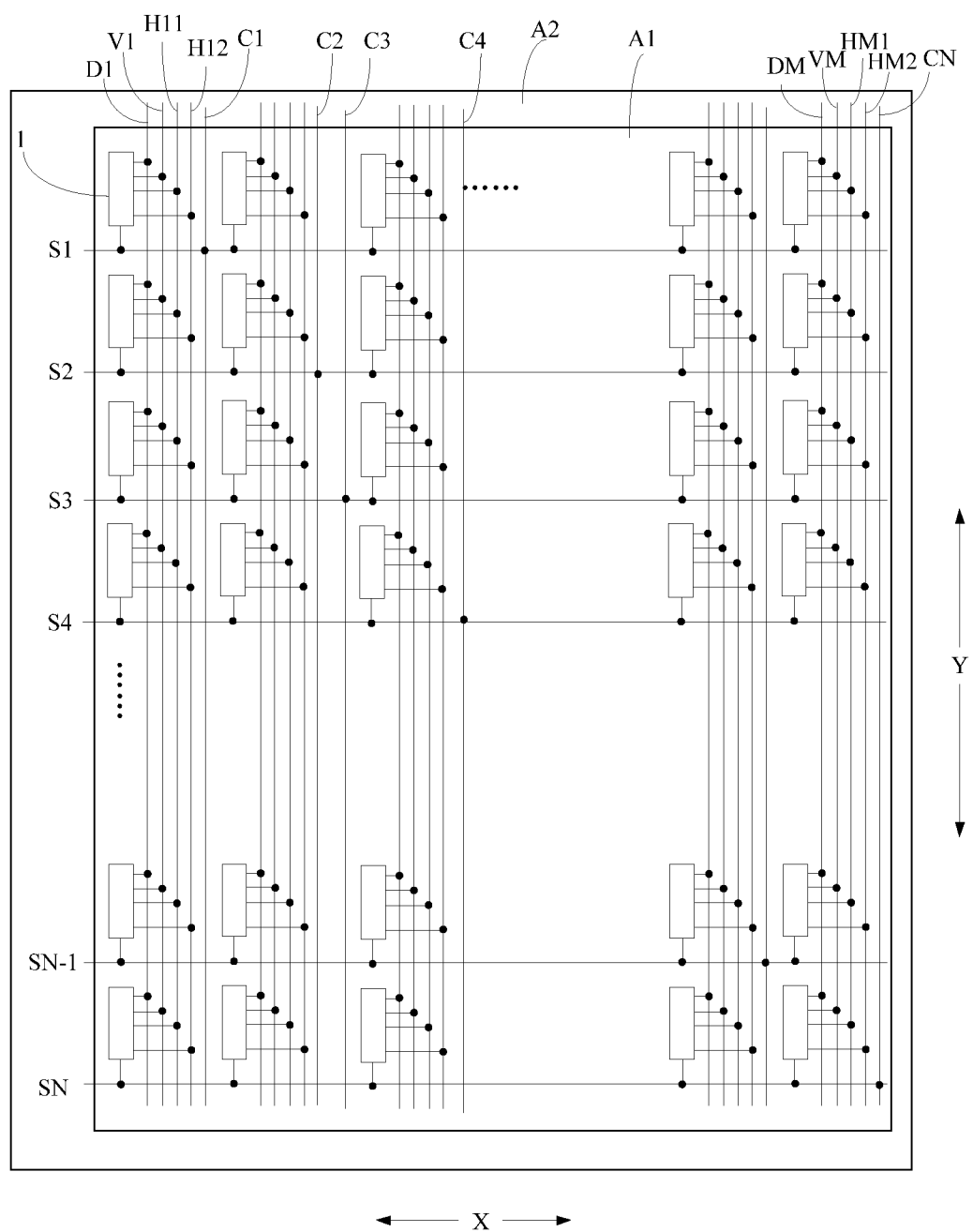
FIG. 6 is a schematic structural diagram of yet another array substrate provided by an embodiment of the present disclosure.

Optionally, in the array substrate provided by the embodiment of the present disclosure, as shown in FIG. 6, when the quantity N of the pixel rows is larger than the quantity M of the pixel columns in the display region A1, namely, N>M.

At least one of the scanning signal routing wires Cn is arranged on each of two sides of at least one of the pixel columns (for example, in FIG. 6, one scanning signal routing wire C1 is arranged on a left side of the second pixel column, and two scanning signal routing wires C2 and C3 are arranged on a right side of the second pixel column), and at least one of the scanning signal routing wires Cn is arranged between at least part of every two adjacent pixel columns.

During specific implementation, every K adjacent pixel columns are a group of repeat elements, in each group of repeat elements, at least one scanning signal routing wire is arranged on each of two sides of one pixel column, for example, two scanning signal routing wires are arranged on one side of the pixel column, and one scanning signal routing wire is arranged on the other side of the pixel column and at most one scanning signal routing wire is arranged on each of two sides of the other (K−1) pixel columns, for example, one scanning signal routing wire is arranged on one side of each of the (K−1) pixel columns, no scanning signal routing wire (for example, the pixel column is located on the outermost side of a display panel) or only one scanning signal routing wire (for example, the pixel column is located on the non-outermost side of the display panel) is arranged on the other side of each of the (K−1) pixel columns or, wherein K=(min[N,M])/|N−M|.

Taking N=135 and M=120 for example, two scanning signal routing wires are correspondingly arranged on the two sides of each of 15 pixel columns respectively, in order to uniformly distribute the 15 pixel columns among the 120 pixel columns, at least one scanning signal routing wire needs to be arranged on the two sides of one pixel column among every 8 pixel columns respectively. Every 8 adjacent pixel columns are taken as a group of repeat elements, there is a total of 15 groups of repeat elements. One pixel column is selected from each of the groups of repeat element to have at least one scanning signal routing wire arranged on each of its two sides, and at most one scanning signal routing wire is arranged on each of the two sides of each of the other 7 pixel columns.

Figure 7:
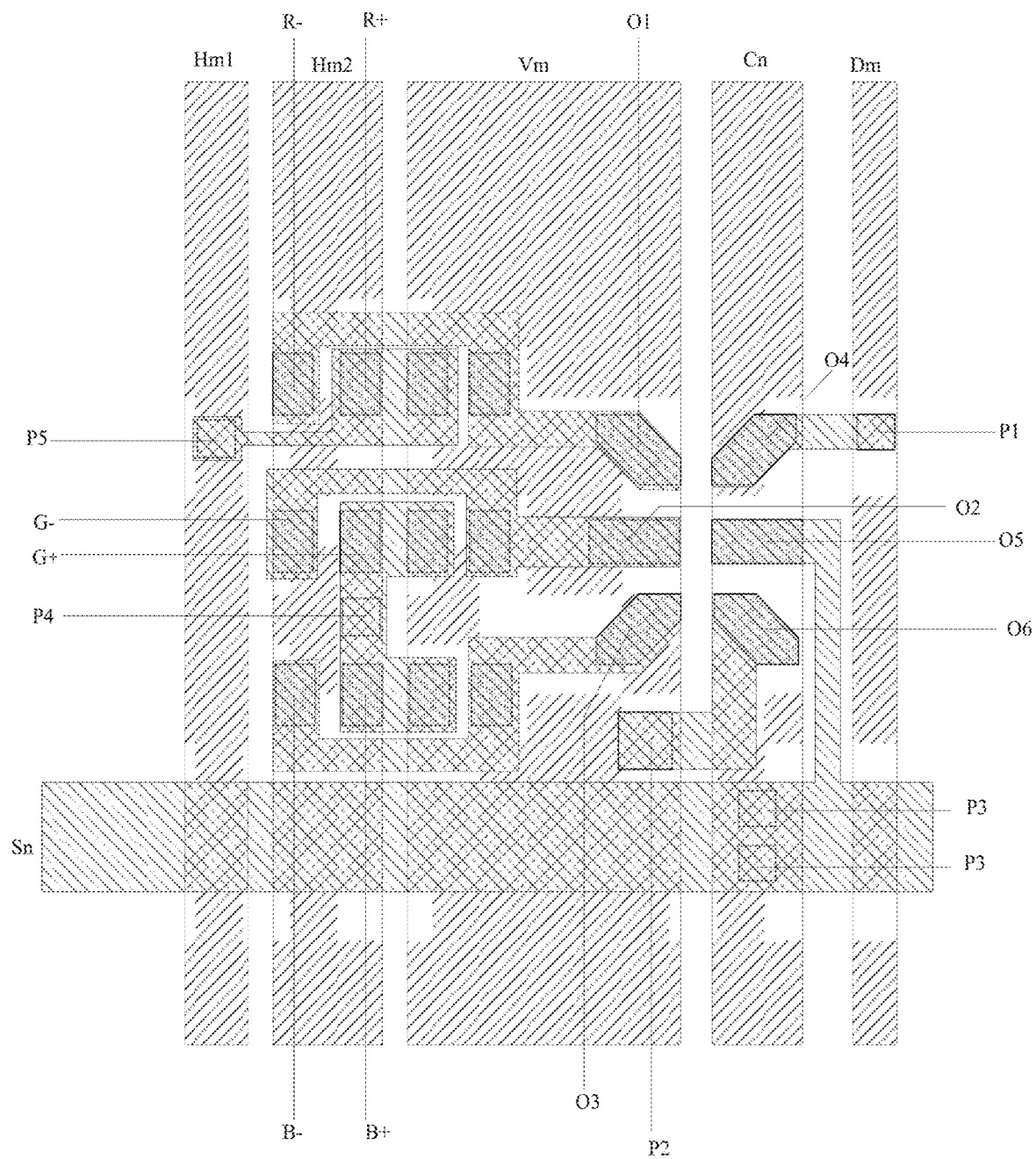
FIG. 7 is a schematic structural diagram of an array layout to which a pixel column correspond in an array substrate provided by an embodiment of the present disclosure.
Figure 8:
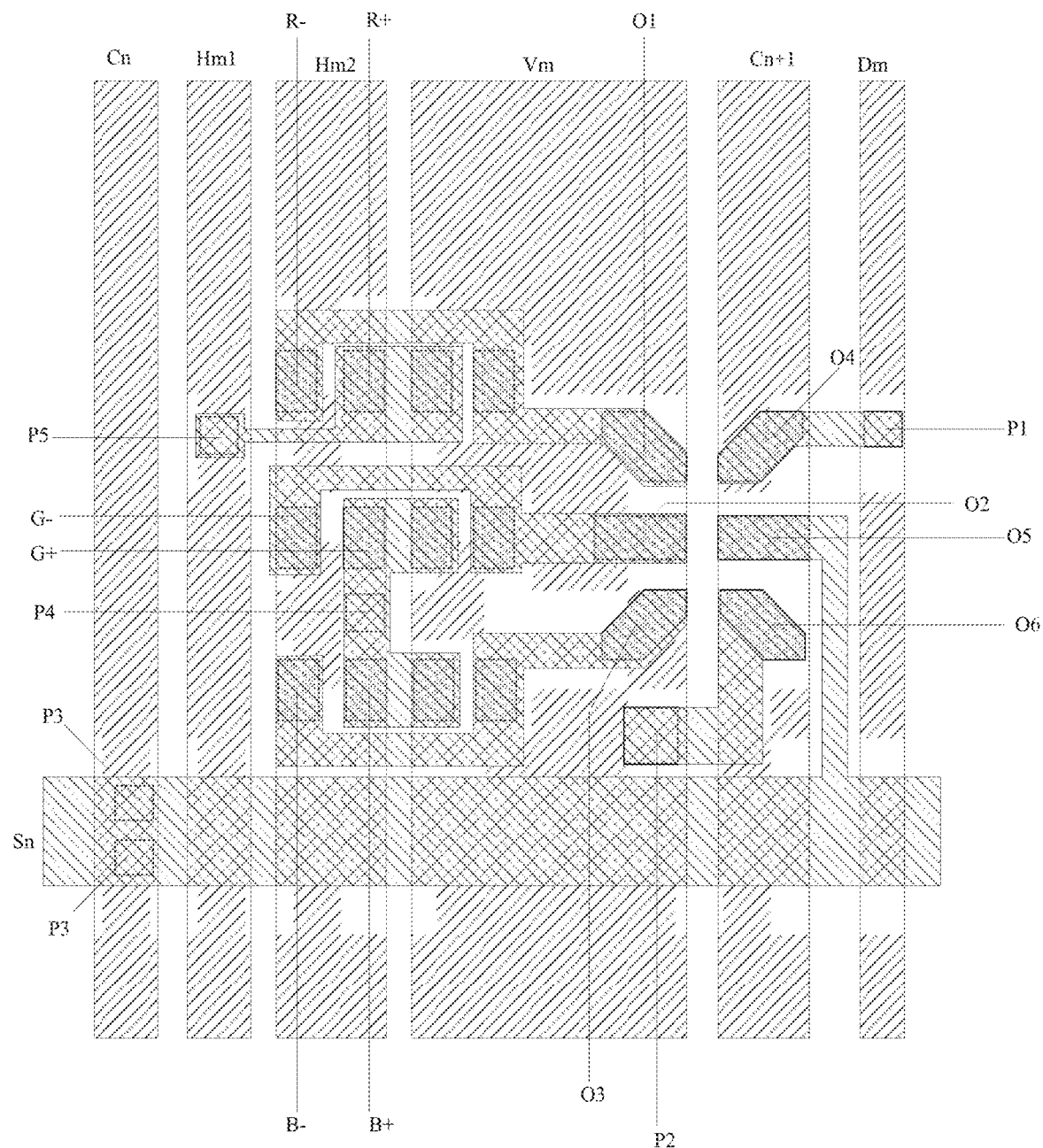
FIG. 8 is a schematic structural diagram of another array layout to which a pixel column corresponds in an array substrate provided by an embodiment of the present disclosure.

Optionally, in the array substrate provided by the embodiment of the present disclosure, as shown in FIG. 7 and FIG. 8, the scanning lines Sn are arranged in the same first metal layer, and the scanning signal routing wires Cn, the data signal lines Dm, the reference signal lines Vm and the positive signal lines Hm1 and Hm2 are arranged in the same second metal layer.

In the embodiment of the present disclosure, two structures are 'arranged in the same layer' or "located in the same layer" may mean that the both are formed in the same film forming process, or in the same patterning process, or located in the same layer in a cascading relation, or may represent equal distances between the both and a substrate.

Specifically, in the array substrate provided by the embodiment of the present disclosure, the first metal layer may be located on one side of the second metal layer far away from a base substrate 100, or the second metal layer is located on one side of the first metal layer far away from the base substrate 100, which is not limited herein.

During specific implementation, as shown in FIG. 7 and FIG. 8, each pixel driving chip (not shown in FIG. 7 and FIG. 8) has a first signal end O1, a second signal end O2, a third signal end O3, a fourth signal end O4, a fifth signal end O5 and a sixth signal end O6. The first signal end O1 is connected with a negative electrode R− of the first color inorganic light-emitting diode, the second signal end O2 of the pixel driving chip is connected with a negative electrode G− of the third color inorganic light-emitting diode, the third signal end O3 of the pixel driving chip is connected with a negative electrode B− of the second color inorganic light-emitting diode, the fourth signal end O4 of the pixel driving chip is connected with the scanning lines Sn, the fifth signal end O5 of the pixel driving chip is connected with the data signal lines Dn through a via hole P1, the sixth signal end O6 of the pixel driving chip is connected with the reference signal lines Vm through a via hole P2, the positive electrode R+ of the first color inorganic light-emitting diode is connected with the positive signal line Hm1 through a via hole P5, the positive electrode G+ of the third color inorganic light-emitting diode is connected with the positive signal line Hm2 through a via hole P4, and the positive electrode B+ of the second color inorganic light-emitting diode is connected with the positive signal line Hm2 through a via hole 4.

FIG. 7 is a schematic structural diagram of arranging only one scanning signal routing wire Cn on two sides of a pixel column in a row direction, and in FIG. 7, the scanning signal routing wire Cn is connected with the scanning line Sn through a via, hole P3.

FIG. 8 is a schematic structural diagram of arranging scanning signal routing wires (Cn and $C_{n+1}$) on two sides of a pixel column in a row direction respectively, and in FIG. 8, the scanning signal routing wire Cn is connected with the scanning line Sn through the via, hole P3, and the scanning signal routing wire $C_{n+1}$ is connected with the other scanning lines (not shown in FIG. 8).

Figure 9:
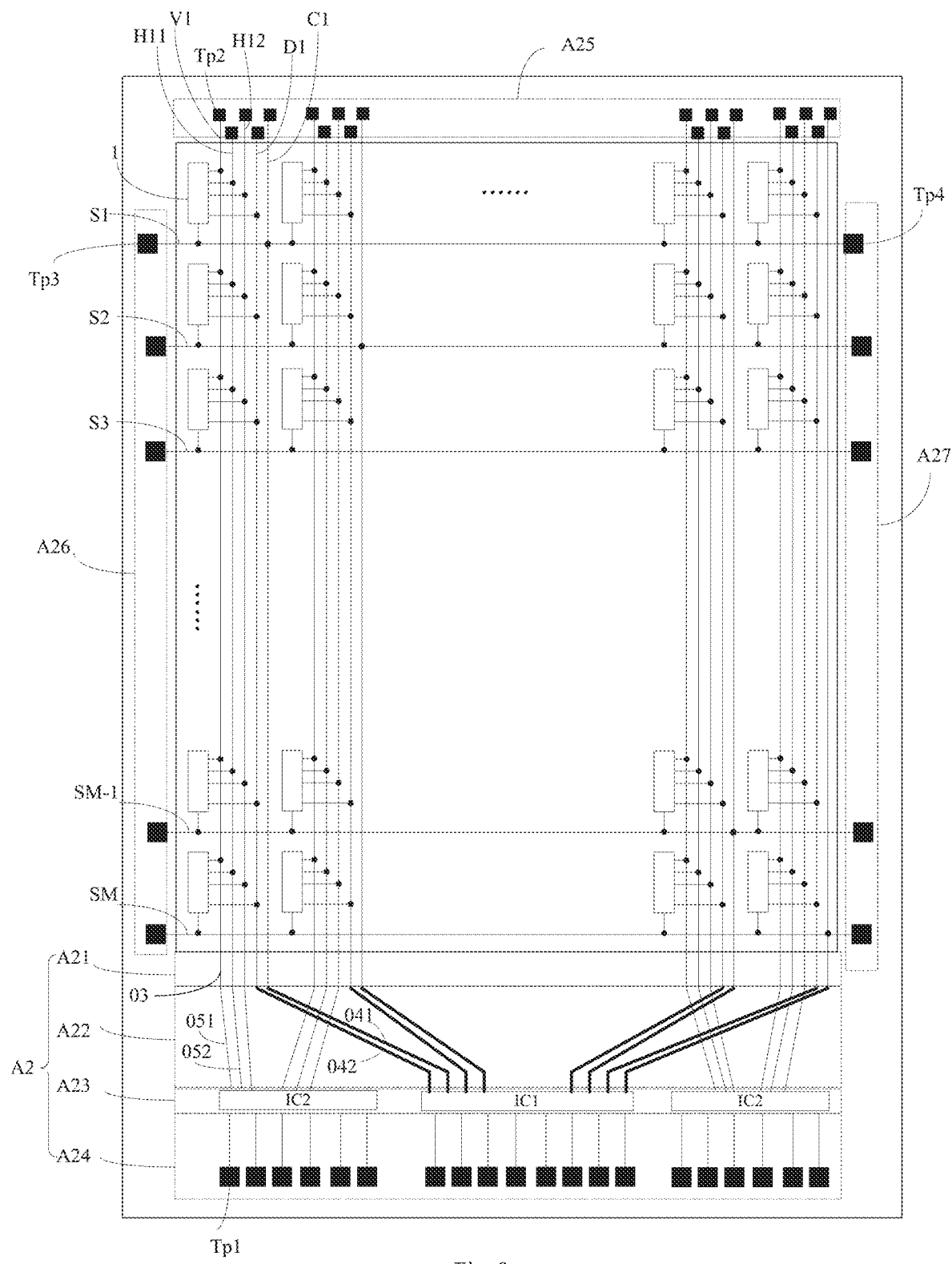
FIG. 9 is a schematic structural diagram of yet another array substrate provided by an embodiment of the present disclosure.

Optionally, in the array substrate provided by the embodiment of the present disclosure, as shown in FIG. 9, the bezel region A2 located at one end of the data signal lines Dm includes a bent region A21, a wiring region A22 and a bonding region A23 sequentially far away from the display region.

The bonding region A23 is provided with at least one first chip IC1 and at least one second chip IC2.

The scanning signal routing wires Cn and the data signal lines Dm are sequentially connected with the first chip IC1 in a bonding mode through routing wires located in the bent region A21 and the wiring region A22.

The reference signal lines Vm and the positive signal lines Hm are sequentially connected with the second chip IC2 in a bonding mode through routing wires located in the bent region A21 and the wiring region A22.

During specific implementation, in the array substrate provided by the embodiment of the present disclosure, only one first chip and only one second chip may be arranged in the bonding region. In this way, the quantity of chips can be reduced.

Figure 13:
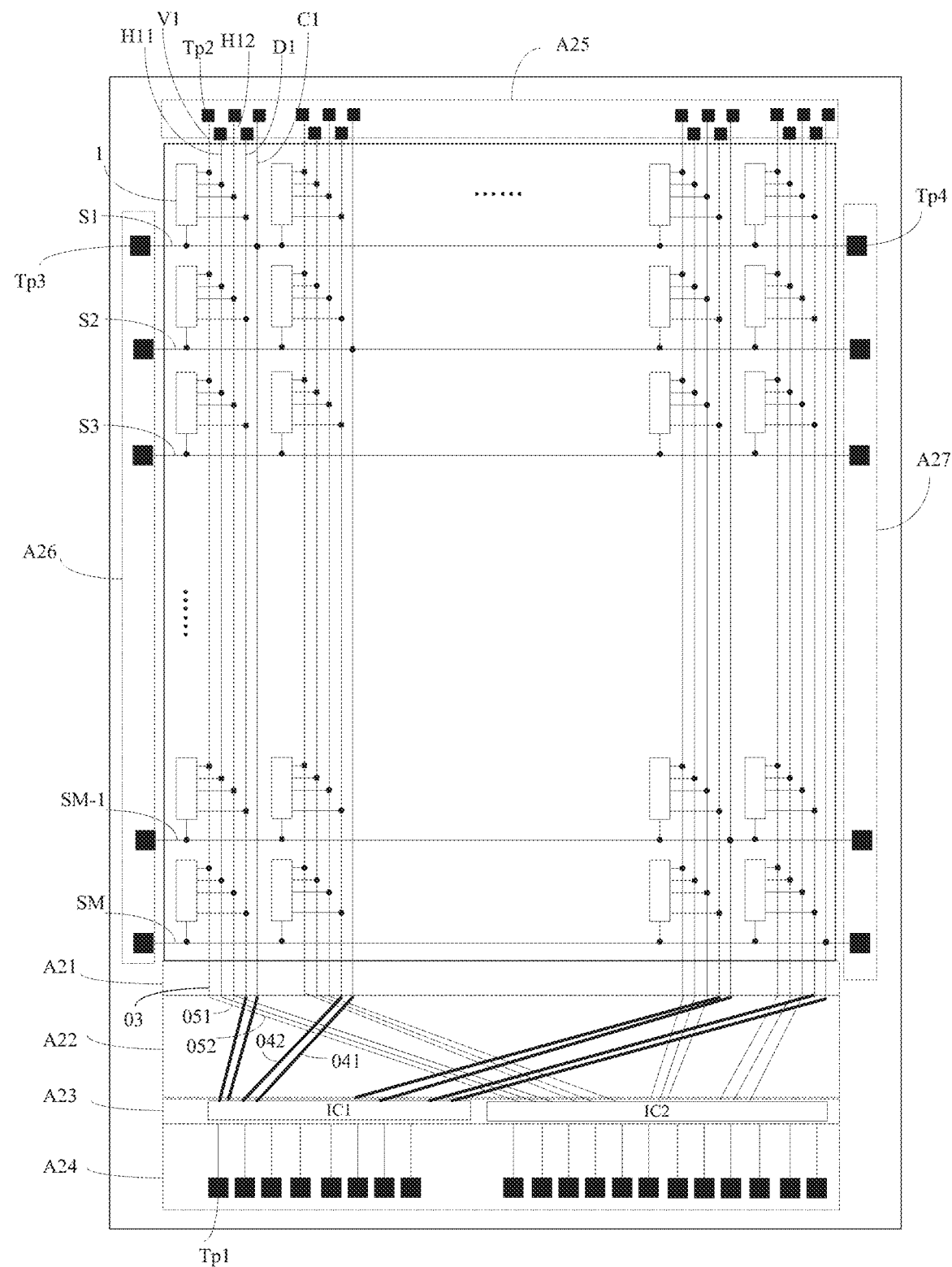
FIG. 13 is a schematic structural diagram of yet another array substrate provided by an embodiment of the present disclosure.

During specific implementation, when only one first chip IC1 and one second chip IC2 are arranged in the bonding region A23, for example, as shown in FIG. 13, the first chip IC1 is located on a left side, the second chip IC2 is located on a right, side, so the routing wires on a left side of the wiring region A22 is closer to the first chip IC1 and farther from the second chip IC2 and the routing wires on a right side of the wiring region A22 is farther from the first chip IC1 and closer to the second chip IC2, that is, routing wires on the left side of the wiring region A22 and the routing wires on the right side of the wiring region A22 are different in distances from the same chip, which leads to large difference among lengths of the routing wires in the wiring region, namely, inconsistent loading of the routing wires, and consequently, display is non-uniform.

During specific implementation, the scanning signal routing wires provide digital voltage signals which function as controlling when to write the signals on the data signal lines into the pixel driving chips. Thus, the breakover current on the scanning signal routing wires and the data signal lines is small and is insensitive to IR drop generated by the routing wires of the wiring region, so in the wiring region, widths of the corresponding routing wires may be arranged relatively narrower and/or their lengths may be arranged relatively longer. Signals on the reference signal lines and the positive signal lines are all fixed voltage signals, however, they are connected in the current path of the inorganic light-emitting diodes in series and there is current of mA magnitude flowing through the current path, so IR drop generated by the routing wires of the wiring region may affect signals of the current path, in this case, a requirement for the widths ad the lengths of the routing wires of the wiring region is high, and it is needed to increase the wire widths and/or decrease the wire lengths as much as possible.

Therefore, in the array substrate provided by the embodiment of the present disclosure, as shown in FIG. 9, a plurality of first chips IC1 and a plurality of second chips IC2 are arranged in the bonding region A23, and the first chips IC1 and the second chips IC2 are distributed in the bonding region A23 at intervals so that the difference among the lengths of the routing wires of the wiring region can be reduced.

Furthermore, the first chips may be arranged in a position closer to a center of the bonding region, and the second chips may be arranged in a position closer to two sides of the bonding region so that the routing wires connected with the first chips may be arranged relatively longer and the routing wires connected with the second chips may be arranged relatively shorter.

Furthermore, in the array substrate provided by the embodiment of the present disclosure, as functions of the signal lines are different, signals need to be provided by using the different chips, however, different types of signals can be provided by using a single chip, in this case, pin distribution of the chips may be arranged also with reference to the above rule, for example, pins providing the signals for the scanning signal routing wires and the data signal lines are arranged in a middle region of the chip, and pins providing the signals for the reference signal lines and the positive signal lines are arranged at the two ends of the chip. Optionally, in the array substrate provided by the embodiment of the present disclosure, as shown in FIG. 9, the routing wires 03 of the bent region A21 are all located in the second metal layer.

Figure 10:
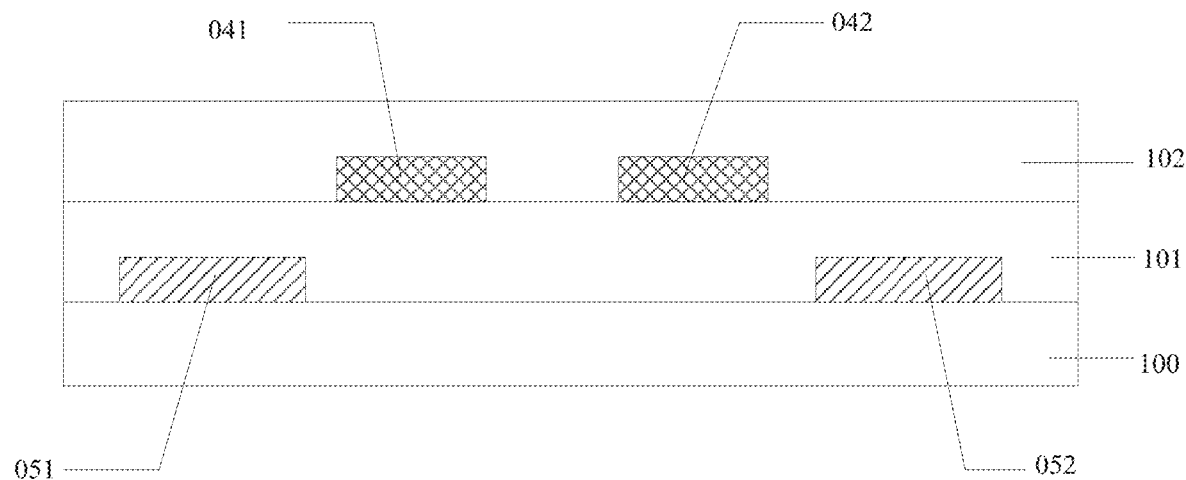
FIG. 10 is a schematic structural local sectional view of a wiring region in an array substrate provided by an embodiment of the present disclosure.

Optionally, in the array substrate provided by the embodiment of the present disclosure, as shown in FIG. 9 and FIG. 10, in the wiring region A22, the routing wires 041 connected with the scanning signal routing wires Cn and the routing wires 042 connected with the data signal lines Dm are all located in the first metal layer.

In the wiring region A22, the routing wires 051 connected with the reference signal lines Vm and the routing wires 052 connected with the positive signal lines Hm are all located in the second metal layer. FIG. 10 takes the second metal layer being located between the first metal layer and the base substrate 100 for example. Specifically, a planarization layer 101 is further arranged between the first metal layer and the second metal layer, and a protective layer 102 is further arranged on the first metal layer.

During specific implementation, a material of the planarization layer may be silicon oxide or silicon nitride or other inorganic materials, or may be an organic material such as resin, which is not limited herein.

During specific implementation, a material of the protective layer may be silicon oxide or silicon nitride or other inorganic materials, or may be an organic material such as resin, which is not limited herein.

Or optionally, in the array substrate provided by the embodiment of the present disclosure, in the wiring region, the routing wires connected with the scanning signal routing wires and the routing wires connected with the data signal lines are all located in the second metal layer.

In the wiring region, the routing wires connected with the reference signal lines and the routing wires connected with the positive signal lines are all located in the first metal layer.

During specific implementation, in the array substrate provided by the embodiment of the present disclosure, in the wiring region, the routing wires are arranged in the two metal layers so that a problem of a limited space of the wiring region can be solved.

During specific implementation, in the array substrate provided by the embodiment of the present disclosure, after a manufacture procedure of the array substrate is completed, the wiring region and the bonding region are bent to a back of the display panel through the bent region so that a bezel of the display panel can be reduced.

During specific implementation, in the array substrate provided by the embodiment of the present disclosure, as shown in FIG. 9, the scanning signal routing wires Cn, the data signal lines Dm, the reference signal lines Vm and the positive signal lines Hal are all regulated to be longitudinal signal lines.

The bezel region A2 further includes: a first signal input region A24 located on one side of the bonding region A23 far away from the wiring region A22, and a second signal input region A25 located at one end of the data signal lines Dm far away from the bent region A21.

First input electrodes Tp1 in one-to-one correspondence with all the longitudinal signal lines are arranged in the first signal input region A24, and all the longitudinal signal lines in the display region A1 are connected with the corresponding first input electrodes Tp1 sequentially through the routing wires located in the bent region A21 and the wiring region A22.

Second input electrodes Tp2 in one-to-one correspondence connection with all the longitudinal signal lines are arranged in the second signal input region A25.

For example, in the wiring region A22, the routing wires 041 connected with the scanning signal routing wires Cn and the routing wires 042 connected with the data signal lines Dm are all located in the first metal layer, and in the wiring region A22, the routing wires 051 connected with the reference signal lines Vm and the routing wires 052 connected with the positive signal lines Hm are all located in the second metal layer.

Figure 11:
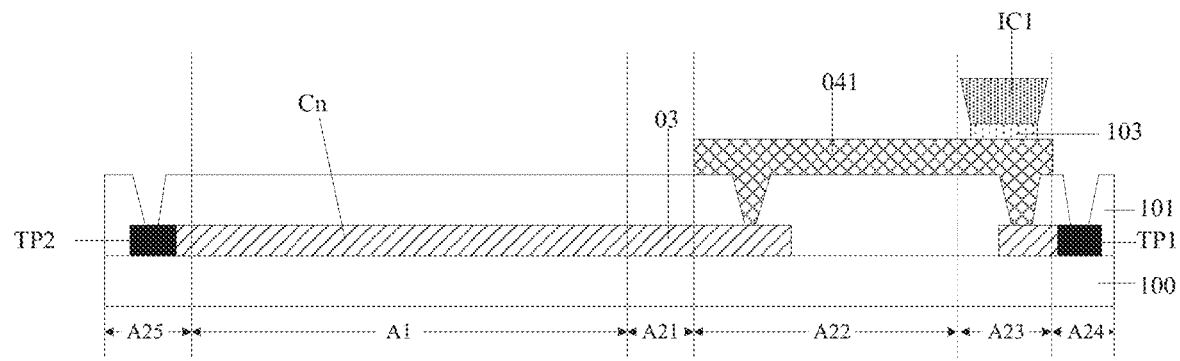
FIG. 11 is a schematic structural sectional view of scanning signal routing wires in an array substrate provided by an embodiment of the present disclosure.

Specifically, as shown in FIG. 11, the scanning signal routing wires Cn located in the second metal layer are bonded to the first chip IC1 in the bonding region A23 via a transparent conductive layer 103 sequentially through the routing wires 03 located in the bent region A21 and in the second metal layer and the routing wire 041 located in the wiring region A22 and in the first metal layer, and are connected with the first input electrodes Tp1 in the first signal input region A24. A film layer relation of the data signal lines is the same as the scanning signal routing wires and will not be repeated in detail herein.

Figure 12:
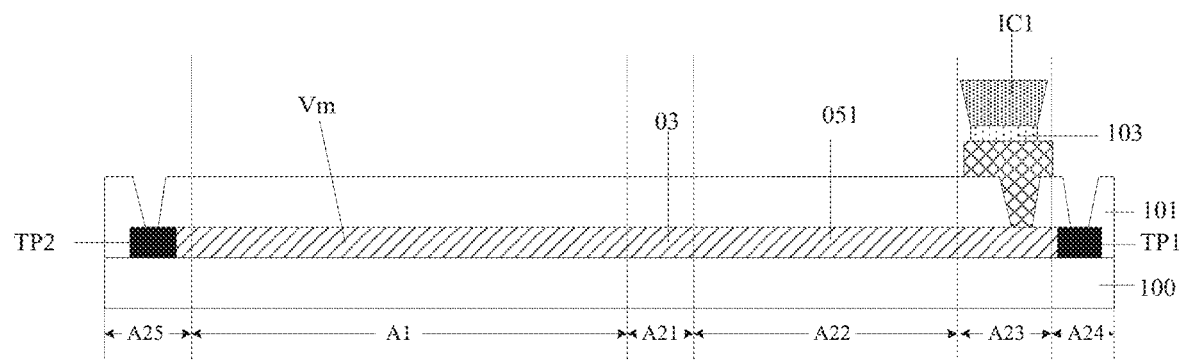
FIG. 12 is a schematic structural sectional view of reference signal lines in an array substrate provided by an embodiment of the present disclosure.

Specifically, as shown in FIG. 12, the reference signal lines Vm located in the second metal layer are bonded to the second chip IC2 in the bonding region A23 via the first metal layer and the transparent conductive layer 103 sequentially through the routing wires 03 located in the bent region A21 and in the second metal layer and the routing wires 051 located in the wiring region A22 and in the second metal layer, and are connected with the first input electrodes Tp1 in the first signal input region A24. A film layer relation of the positive signal lines is the same as the reference signal lines and will not be repeated in detail herein.

Optionally, in the array substrate provided by the embodiment of the present disclosure, as shown in FIG. 9, the bezel region A2 located at one end of the scanning lines Sn includes a third signal input region A26; the bezel region located at the other end of the scanning lines Sn includes a fourth signal input region A27; third input electrodes Tp3 in one-to-one correspondence connection with all the scanning lines Sn are arranged in the third signal input region A26; and fourth input electrodes Tp4 in one-to-one correspondence connection with all the scanning lines Sn are arranged in the fourth signal input region A27.

During specific implementation, whether all the longitudinal signal lines on the array substrate are normal can be detected in a mode of inputting signals into one input electrode and detecting signals of other input electrodes. After the detection is completed and it is determined that it is a non-defective product, the signal input region can be cut off, which will not affect later-stage use of the panel.

Figure 14:
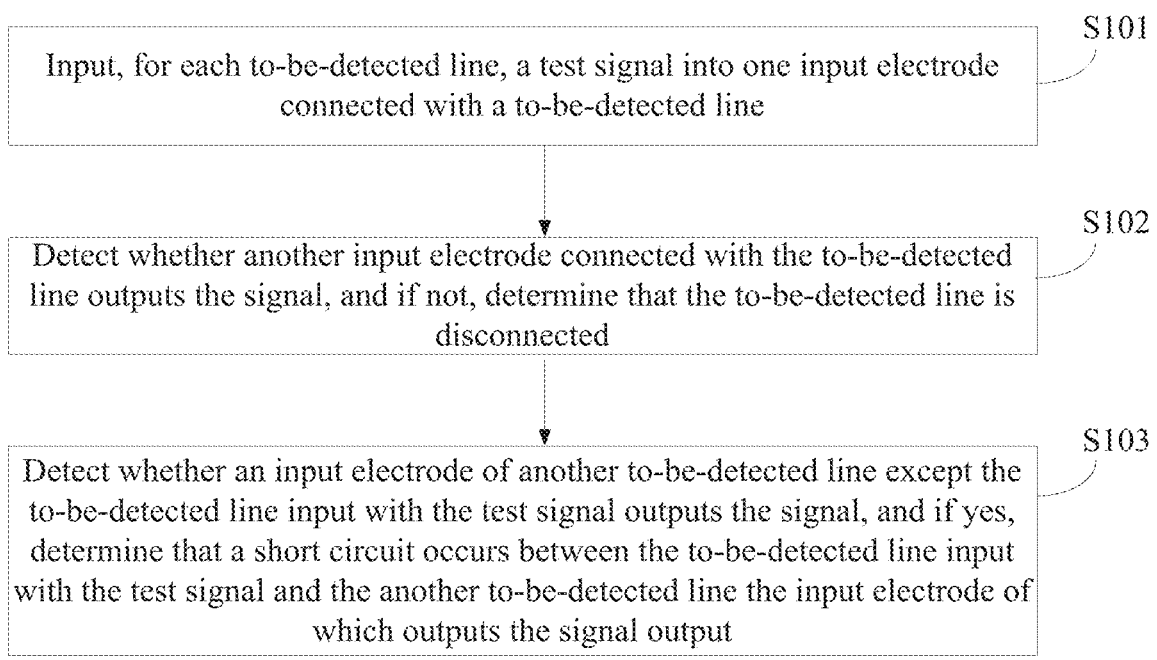
FIG. 14 is a flowchart of a method for detecting the array substrate provided by an embodiment of the present disclosure.

Based on the same inventive concept, an embodiment of the present disclosure further provides a method for detecting any array substrate provided by an embodiment of the present disclosure. The longitudinal signal lines and the scanning lines in the display region are all regulated to be to-be-detected lines, as shown in FIG. 14, the method includes the following.

S101, for each of the to-be-detected lines, a test signal is input into one input electrode connected with the to-be-detected line.

S102, whether another input electrode connected with the to-be-detected line output a signal is detected, and if not, it is determined that the to-be-detected line is disconnected.

S103, whether an input electrode of other to-be-detected line except the to-be-detected line being input with the test signal output a signal is detected, and if yes, it is determined that a short circuit occurs between the to-be-detected line input with the test signal and the other to-be-detected line the input electrode of which output the signal.

By means of the method provided by the embodiment of the present disclosure, whether the short circuit or disconnection happens to the to-be-detected line can be detected by inputting the signal into the input electrode and detecting the signal output by the other input electrode, and the method is simple. Besides, the method is applied to a fabrication process of the array substrate so as to reduce cost.

During specific implementation, in the method provided by the embodiment of the present disclosure, a sequence of step S102 and step S103 is not limited. Step S102 may be executed preceding step S103 and vice versa, which is not limited herein.

Application of the method for detecting the array substrate provided by the embodiment of the present disclosure is described below through an embodiment.

During specification implementation, taking the second metal layer being located below the first metal layer for example, during manufacturing, the second metal layer is fabricated first, and the scanning signal routing wires, the data signal lines, the reference signal lines and the positive signal lines are formed in the second metal layer as for the reference signal lines and the positive signal lines, at the moment, the first input electrodes in the first signal input region and the second input electrodes in the second signal input region cooperate with each other for use so as to detect whether the reference signal lines and the positive signal lines are normal, for example, the test signal is input into the first input electrode of one of the reference signal lines, whether the second input electrode connected with the reference signal line outputs the signal is detected, if yes, it is determined that the reference signal line is normal, and if not, it is determined that the reference signal line is disconnected and then is repaired. Whether the first input electrodes or the second input electrodes connected with other signal lines except the reference signal line output the signal is detected, and if not, it is determined that the short circuit does not occur between the reference signal line and other signal lines, and if yes, it is determined that the short circuit occurs between the reference signal line and the other signal lines and the short-circuit signal line is repaired. After all the reference signal lines and the positive signal lines are normal, the planarization layer continues to be deposited, and via holes are formed in the planarization layer. At the moment, detection for the reference signal lines and the positive signal lines is repeated, after a detected result is normal, the second metal layer continues to be deposited, the scanning lines are formed in the second metal layer, and connection of the data signal lines and the scanning signal routing wires with the signals of first output electrodes is completed. At the moment, the first signal input regions of the first signal input region, the second input electrodes in the second signal input region, the third input electrodes in the third signal input region and the fourth input electrodes in the fourth signal input region cooperate with one another for use so as to detect whether all the signal lines on the array substrate are normal, and if there is the short circuit or disconnection occurring, repair is made till all the signal lines are normal, and then subsequent manufacture procedure continues. Therefore, a situation that the array substrate is scraped subsequently due to the signal lines being abnormal is avoided, and thus production cost is reduced.

Based on the same inventive concept, an embodiment of the present disclosure further provides a splicing display panel, including a plurality of array substrates provided by an embodiment of the present disclosure. As a principle of solving problems of the display panel is similar to the above mentioned array substrate, implementation of the splicing display panel may refer to implementation of the above mentioned array substrate, and repetitions are omitted.

During specific implementation, in the splicing display panel provided by the embodiment of the present disclosure, the second signal input region, the third signal input region and the fourth signal input region in the array substrate can be cut after the manufacture procedure of the array substrate is completed, which does not affect the subsequent splicing manufacture procedure, and the wiring region and the bonding region are bent to the back of the display panel through the bent region so that a width of the bezel of the display panel can be reduced.

During specific implementation, in the splicing display panel provided by the embodiment of the present disclosure, wiring regions and bonding regions of the plurality of array substrates are bent to the backs of the display panels through the bent regions, its technical value is quite high because of its advantages of few patterning process, no need of a back process, low process complexity, a small bezel and the like.

In the array substrate, the method for detecting the array substrate and the splicing display panel provided by the embodiments of the present disclosure, each of the pixels in the array substrate includes: sub-pixels of at least three colors and the pixel driving chip driving each of the sub-pixels to emit light; each of the sub-pixels includes at least one inorganic light-emitting diode; the display region further includes: the positive signal lines connected with the positive electrodes of the inorganic light-emitting diodes, and the data signal lines, the scanning lines and the reference signal lines connected with the pixel driving chips; and the pixel driving chip is configured to write the signal of the data signal line into the sub-pixels of the different colors in a time division under control of the scanning lines. That is, in the embodiment of the present disclosure, all the pixels are driven directly through the pixel driving chips so as to realize display, Besides, as all the pixels are driven directly through the pixel driving chips, large current density can be provided for the micro inorganic light-emitting diode.

Apparently, those skilled in the art can make various changes and transformations for the present disclosure without departing from the spirit and the scope of the present disclosure. In this case, if these changes and transformations of the present disclosure fall within the scope of the claims and their equivalents of the present disclosure, the present disclosure also intend to include these changes and transformations.

What is claimed is:
1. An array substrate, comprising:
a display region, provided with a plurality of scanning lines, a plurality of data signal lines, a plurality of positive signal lines and a plurality of reference signal lines, and a plurality of pixels arranged in an array mode; and
a bezel region; wherein
at least one of the plurality of pixels comprises: sub-pixels of at least three colors and a pixel driving chip driving each of the sub-pixels to emit light;
each of the sub-pixels comprises at least one inorganic light-emitting diode;
the pixel driving chip is connected with a positive electrode of the inorganic light-emitting diode in each of the sub-pixels it drives, at least one of the plurality of data signal lines, at least one of the plurality of scanning lines and at least one of the plurality of reference signal lines; and
the pixel driving chip is configured to write a signal of the data signal line into the sub-pixels of different colors under control of the scanning line, corresponding to the pixel driving chip, in a time division, wherein the reference signal line is configured to provide a negative signal for the pixel driving chip so as to form a current path between the inorganic light-emitting diode and the pixel driving chip;
wherein the plurality of pixels comprise N pixel rows arranged in a first direction and M pixel columns arranged in a second direction, wherein N and M are both integers larger than 1;
the plurality of scanning lines extend in the first direction and are arranged in the second direction, the plurality of data signal lines extend in the second direction and are arranged in the first direction, the plurality of positive signal lines extend in the second direction and are arranged in the first direction, and the plurality of reference signal lines extend in the second direction and are arranged in the first direction; and the first direction is different from the second direction;

wherein each of the pixels comprises: a first color sub-pixel, a second color sub-pixel and a third color sub-pixel;

each of the pixel rows corresponds to one of the plurality of scanning lines, and each of the pixel columns corresponds to one of the plurality of data signal lines, one of the plurality of reference signal lines and two of the plurality of positive signal lines; and one of the two positive signal lines is connected with a positive electrode of an inorganic light-emitting diode in the first color sub-pixel, and the other of the two positive signal lines is connected with positive electrodes of inorganic light-emitting diodes in the third color sub-pixel and the second color sub-pixel;

wherein the display region further comprises scanning signal routing wires connected with the plurality of scanning lines in a one-to-one correspondence, and the scanning signal routing wires extend in the second direction;

wherein the scanning lines are in a first metal layer, and the scanning signal routing wires, the data signal lines, the reference signal lines and the positive signal lines are in a second metal layer;

wherein the bezel region at one end of the data signal lines comprises a bent region, a wiring region and a bonding region sequentially far away from the display region;

at least one first chip and at least one second chip are arranged in the bonding region;

the scanning signal routing wires and the data signal lines are sequentially connected with the first chip in a bonding mode through routing wires in the bent region and the wiring region; and the reference signal lines and the positive signal lines are sequentially connected with the second chip in a bonding mode through routing wires in the bent region and the wiring region.

2. The array substrate according to claim 1 wherein:
each of the pixel rows corresponds to one of the plurality of scanning lines, and each of the pixel columns corresponds to one of the plurality of data signal lines, one of the plurality of reference signal lines and one of the plurality of positive signal lines.

3. The array substrate according to claim 1, wherein:
N=M, one side of each of the pixel columns is correspondingly provided with one of the scanning signal routing wires, and only one of the scanning signal routing wires is arranged between every two adjacent pixel columns.

4. The array substrate according to claim 1, wherein:
N>M, at least one of the scanning signal routing wires is arranged on each of two sides of at least one of the pixel columns; and at least one of the scanning signal routing wires is arranged between at least part of every two adjacent pixel columns, and a quantity of the scanning signal routing wires between the two adjacent pixel columns does not exceed two.

5. A splicing display panel, comprising a plurality of array substrates according to claim 1.

6. The array substrate according to claim 5, wherein:
N=M, one side of each of the pixel columns is correspondingly provided with one of the scanning signal routing wires, and only one of the scanning signal routing wires is arranged between every two adjacent pixel columns.

7. The array substrate according to claim 5, wherein:
N>M, at least one of the scanning signal routing wires is arranged on each of two sides of at least one of the pixel columns; and at least one of the scanning signal routing wires is arranged between at least part of every two adjacent pixel columns, and a quantity of the scanning signal routing wires between the two adjacent pixel columns does not exceed two.

8. The array substrate according to claim 1, wherein:
a plurality of first chips and a plurality of second chips are arranged in the bonding region; and the first chips and the second chips are distributed in the bonding region at intervals.

9. The array substrate according to claim 1, wherein:
the routing wires in the bent region are all in the second metal layer.

10. The array substrate according to claim 1, wherein:
in the wiring region, the routing wires connected with the scanning signal routing wires and the routing wires connected with the data signal lines are all in the first metal layer; and in the wiring region, the routing wires connected with the reference signal lines and the routing wires connected with the positive signal lines are all in the second metal layer.

11. The array substrate according to claim 1 wherein:
in the wiring region, the routing wires connected with the scanning signal routing wires and connected with the data signal lines are all in the second metal layer; and in the wiring region, the routing wires connected with the reference signal lines and connected with the positive signal lines are all in the first metal layer.

12. The array substrate according to claim 1, wherein:
the scanning signal routing wires, the data signal lines, the reference signal lines and the positive signal lines are all longitudinal signal lines;

the bezel region further comprises: a first signal input region on one side of the bonding region far away from the wiring region and a second signal input region at one end of the data signal lines far away from the bent region;

first input electrodes in one-to-one correspondence with the longitudinal signal lines are arranged in the first signal input region, and the respective longitudinal signal lines in the display region are connected with the respective first input electrodes sequentially through the routing wires in the bent region and the wiring region; and second input electrodes in one-to-one correspondence connection with the longitudinal signal lines are arranged in the second signal input region.

13. The array substrate according to claim 12, wherein:
the bezel region at one end of the scanning lines comprises a third signal input region;

the bezel region at another end of the scanning lines comprises a fourth signal input region;

third input electrodes in one-to-one correspondence connection with the scanning lines are arranged in the third signal input region; and fourth input electrodes in one-to-one correspondence connection with the scanning lines are arranged in the fourth signal input region.

14. A method for detecting the array substrate according to claim 12, wherein the longitudinal signal lines and the scanning lines in the display region are all to-be-detected lines, and the method comprises:

inputting, for each of the to-be-detected lines, a test signal into one input electrode connected with a to-be-detected line;

detecting whether another input electrode connected with the to-be-detected line outputs a signal, and in response to that the another input electrode connected with the to-be-detected line does not output the signal, determining that the to-be-detected line is disconnected; and detecting whether an input electrode of another to-be-detected line except the to-be-detected line input with the test signal outputs a signal, and in response to that the input electrode of the another to-be-detected line outputs the signal, determining that a short circuit occurs between the to-be-detected line input with the test signal and the another to-be-detected line the input electrode of which outputs the signal.

\* \* \* \* \*